(12) United States Patent
Dummer

(10) Patent No.: US 9,961,770 B2
(45) Date of Patent: May 1, 2018

(54) SOLDER PADS, METHODS, AND SYSTEMS FOR CIRCUITRY COMPONENTS

(71) Applicant: Cree, Inc., Durham, NC (US)

(72) Inventor: Andrew K. Dummer, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 84 days.

(21) Appl. No.: 14/337,377

(22) Filed: Jul. 22, 2014

(65) Prior Publication Data

US 2016/0029485 A1    Jan. 28, 2016

(51) Int. Cl.
| | | |
|---|---|---|
| *B23K 1/00* | (2006.01) | |
| *B23K 1/20* | (2006.01) | |
| *H05K 1/18* | (2006.01) | |
| *H05K 3/34* | (2006.01) | |
| *F21K 99/00* | (2016.01) | |

(Continued)

(52) U.S. Cl.
CPC ............ *H05K 1/111* (2013.01); *B23K 1/0016* (2013.01); *B23K 1/20* (2013.01); *B23K 31/02* (2013.01); *H05K 1/0295* (2013.01); *H05K 1/181* (2013.01); *H05K 3/3436* (2013.01); *H05K 3/341* (2013.01); *H05K 2201/09381* (2013.01); *H05K 2201/09954* (2013.01); *H05K 2201/10106* (2013.01); *H05K 2203/04* (2013.01); *H05K 2203/048* (2013.01); *Y02P 70/611* (2015.11)

(58) Field of Classification Search
CPC .................................. H05K 1/02; H05K 1/111
USPC ................. 349/56; 228/179.1; 174/259–267; 361/676, 772–774, 767, 768
See application file for complete search history.

(56) References Cited

U.S. PATENT DOCUMENTS 5,683,788 A * 11/1997 Dugan ................ H05K 1/0295
174/261
6,600,175 B1    7/2003 Baretz et al.
(Continued)

FOREIGN PATENT DOCUMENTS

| | | |
|---|---|---|
| CN | 102 281 710 A | 12/2011 |
| JP | 2005 286099 A | 10/2005 |
| WO | WO 2016/014357 A1 | 1/2016 |

OTHER PUBLICATIONS

CN 102281710 A (English Translation).*
(Continued)

*Primary Examiner* — Alexander Garlen
*Assistant Examiner* — Eric T Eide
(74) *Attorney, Agent, or Firm* — Jenkins, Wilson, Taylor & Hunt, P.A.

(57) ABSTRACT

Solder pads, systems, and related methods are provided. A first or second pad include at least one shape for increasing a number of edges available to align at least one part to be soldered thereto. Each solder pad can occupy a same surface area of the substrate. A plurality of circuit elements can be provided over the plurality of solder pads, where some of the circuit elements occupy different surface areas of the substrate and/or the solder pad. A method of providing a solder pad includes providing a substrate, providing a solder pad over the substrate, and providing at least one shape in the solder pad for increasing a number of edges available to align at least one part to be soldered thereto. The pads can attach for example to a surface-mount ceramic component, a submount-free component, a leadframe component and/or a chip on board component.

26 Claims, 10 Drawing Sheets

(51) Int. Cl.
  *H05K 1/11* (2006.01)
  *H05K 1/02* (2006.01)
  *B23K 31/02* (2006.01)

(56) References Cited

U.S. PATENT DOCUMENTS

| | | | |
|---|---|---|---|
| 7,916,495 B2 | 3/2011 | Huang | |
| 8,564,000 B2 | 10/2013 | Hussell et al. | |
| 8,605,446 B2 * | 12/2013 | Ishizaki | H05K 1/0295 361/728 |
| 2007/0272940 A1 * | 11/2007 | Lee | H01L 33/486 257/99 |
| 2008/0179611 A1 | 7/2008 | Chitnis et al. | |
| 2009/0184616 A1 | 7/2009 | Van De Ven et al. | |
| 2009/0185096 A1 | 7/2009 | Park | |
| 2011/0292625 A1 * | 12/2011 | Chen | H05K 1/0295 361/768 |
| 2013/0153281 A1 * | 6/2013 | Benbassat | H01L 23/49805 174/262 |
| 2014/0217436 A1 * | 8/2014 | Hussell | H01L 33/62 257/98 |
| 2014/0217443 A1 | 8/2014 | Heikman et al. | |
| 2015/0223323 A1 * | 8/2015 | O'Flynn | H05K 1/114 174/263 |

OTHER PUBLICATIONS

Cree XLamp XQ-B LED product family data sheet.
Cree XLamp XH-G LED product family data sheet.
International Search Report with Written Opinion for Application No. PCT/US2015/040893 dated Sep. 21, 2015.

* cited by examiner

SOLDER PADS, METHODS, AND SYSTEMS FOR CIRCUITRY COMPONENTS

TECHNICAL FIELD

The present subject matter generally relates to solder pads, methods, and systems, and more particularly to solder pads, methods, and systems for circuitry components.

BACKGROUND

Solid state lighting apparatuses, for example, light emitter packages, devices, and/or light emitting diode (LED) chips are used in a wide variety of lighting applications. Designers utilize various sizes, shapes, and/or designs of solid state lighting apparatuses to accommodate the wide variety of lighting applications, for example, to provide desired electrical and/or optical properties not limited to operability at desired voltages, emission of desired brightness, light density, light output, color, beam size, and/or beam shape.

Solid state lighting apparatuses comprise electrical contacts (e.g., traces, leads, terminals, bond pads, etc.) configured to physically and electrically connect to various circuitry components, for example, within lighting fixtures or lighting components for receiving electrical current from a power supply. In general, electrical contacts of solid state lighting apparatuses are soldered to portions of external circuits or circuitry components, not limited to circuit boards, for example, printed circuit boards (PCBs), metal core printed circuit boards (MCPCB), flex circuitry, etc.

To illuminate the solid state lighting apparatuses in a circuit or other arrangement, it is known to physically and electrically connect the apparatuses to the circuit component, in some aspects, via soldering the electrical contacts of the lighting apparatuses to solder pads disposed on the circuit component. When an electrical bias is applied across the circuit, the solid state apparatuses electrically connected thereto emit light. In conventional systems, solder pads of the external circuit or circuit component must be customized to accommodate the design of the apparatus which will become soldered thereto. That is, conventional solder pads must be customized according to the various sizes, shapes, and/or designs of the solid state lighting apparatus in order to connect the apparatuses to the circuit or circuit component. Providing customized solder pads and/or circuitry having customized solder pads is both time and cost intensive.

Another problem associated with conventional solder pads, methods, and/or systems, involves poor alignment of the apparatuses over the solder pad. During the soldering process, the flow of molten solder material can potentially induce rotation, sliding, and/or misalignment between the solder pad and component or apparatus to be attached thereto. Such misalignments often result in shorted apparatuses, dark spots in the resultant light beam, and/or other defects within the circuitry component.

Despite availability of various solder pads and methods in the marketplace, a need remains for solder pads configured to accommodate a wide variety of differently sized, shaped, and/or designed solid state lighting apparatuses. Solder pads and related methods described herein can advantageously be used to accommodate a wide variety of lighting apparatuses, independent of the apparatus size, shape, and/or design.

SUMMARY

The subject matter disclosed herein relates to novel solder pads, systems, and/or methods. A solder pad for circuitry components can comprise a first pad and a second pad separated from the first pad by a gap. One of the first or the second pad can comprise at least one shape, such as for example a slot, for increasing a number of edges available to align at least one part to be soldered thereto.

A solder pad system for circuitry components is also provided. The system can comprise a substrate, a plurality of solder pads disposed over the substrate, and a plurality of circuit elements disposed over the plurality of pads. Each solder pad can occupy a same surface area of the substrate. Some of the plurality of circuit elements occupy different surface areas of the substrate and/or the solder pad.

A method of providing a solder pad for circuitry components is provided. The method comprises providing a substrate, providing a solder pad comprising a first pad and a second pad over the substrate, wherein the first pad is separated from the second pad by a gap, and providing at least one shape, such as for example a slot, in the first pad or the second pad for increasing a number of edges available to align at least one part to be soldered thereto.

In some aspects, a device for a light emitter is disclosed and comprises a substrate and a plurality of electrically isolated pads supported by the substrate as the pads are configured for separately attaching a plurality of different electrical components to the pads. The pads are configured for separately attaching a plurality of different electrical components to the pads with application of solder only under portions of the different electrical components and without application of solder to areas of the pads that would not be covered by the different electrical components. The pads are configured for separately attaching a plurality of different electrical components to the pads where the electrical components can be light emitting diode (LED) components.

A method of attaching an electrical component to a substrate is also provided, the method comprising selectively attaching one of a plurality of electrical components to a plurality of isolated pads supported by a substrate where the pads are configured for separately attaching a plurality of different electrical components to the pads.

Solder pads, systems, and/or methods as disclosed herein can provide, for example and without limitation, one or more benefits including a reduced cost, improved manufacturability, universal support, electrical connection, and/or physical connection to multiple light emitter devices and/or circuitry components via a universally sized and/or shaped solder pad. These and other objects are achieved according to the subject matter herein.

BRIEF DESCRIPTION OF DRAWINGS

A full and enabling disclosure of the present subject matter is set forth more particularly in the remainder of the specification, including reference to the accompanying figures, relating to one or more embodiments, in which.

DETAILED DESCRIPTION

Figure 1A:
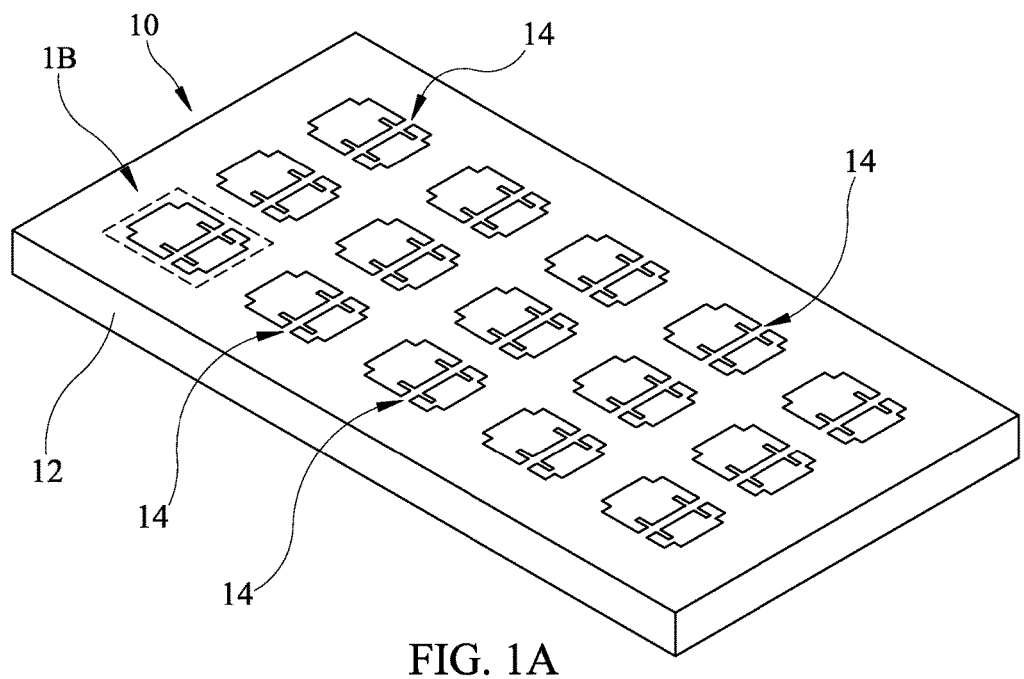
FIG. 1A is a front perspective view illustrating a circuitry component having solder pads according to some aspects.

The subject matter disclosed herein relates to novel solder pads, systems, and/or methods. According to the subject matter herein, multiple (e.g., a variety of) different circuitry components, not limited to light emitter components, can be adapted to utilize a common solder pad and/or solder pad layout. In some aspects, solid state apparatuses (e.g., light emitting diode (LED) apparatuses) are adapted to be interchangeable over a universal solder pad as described herein. Solder pads, systems, and/or methods described herein accommodate different sizes, shapes, types, and/or designs of LED chips and/or apparatuses to utilize a same pad. This allows rapid changeover from one component to another, in addition to improving the ease of manufacture and reducing cost associated with LED chip circuitry components.

Solder pads, systems, and/or methods described herein can utilize shapes, regions, portions, and/or areas, for example and not limited to slots, for improving alignment of different parts (e.g., lighting apparatuses, circuitry components, etc.) to a universal solder pad as described herein. Shapes and/or stepped areas, such as slots for example or any other shapes, can also prevent rotation and/or sliding of a part over solder pads during a soldering process as described herein. This can advantageously improve alignment and location of light emitter components, in particular, smaller components, over solder pad.

Each example and/or embodiment described herein is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions may be exaggerated relative to other structures or portions for illustrative purposes and, thus, are provided to illustrate the general structures of the present subject matter and may or may not be drawn to scale. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

The terms "solid state light emitter" or "solid state emitter" refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The term "substrate" as used herein in connection with solder pads refers to a mounting member, element, or board on which, in which, or over which, multiple solder pads and/or multiple solid state light apparatuses (e.g., LED packages, devices, and/or chips) can be arranged, supported, and/or mounted. Exemplary substrates useful with solder pads and lighting apparatuses as described herein comprise "circuit carriers" or "circuitry components", for example, which refer to printed circuit boards (PCBs), including but not limited to metal core printed circuit boards (MCPCBs), flexible circuit boards, dielectric laminates, ceramic based substrates, ceramic boards having FR4 and/or electrical traces arranged on one or multiple surfaces thereof, support panels, and/or mounting elements of various materials and conformations arranged to receive, support, and/or conduct electrical power to solid state emitters.

The term "solder" as used herein generally refers to any electrically conductive bonding material. Solder can be used for attaching, connecting, joining, or otherwise bonding one or more surfaces. Exemplary solder comprises any solid, liquid, gel or paste, such as an electrically conductive solder paste comprised of one more metals, for example, Au, Sn, Au/Sn, Ag, etc.

Solid state emitters according to aspects of the subject matter herein can comprise III-V nitride (e.g., gallium nitride) based LED chips or laser chips fabricated on a silicon, silicon carbide, sapphire, or III-V nitride growth substrate, including (for example) chips manufactured and sold by Cree, Inc. of Durham, N.C. Such LED chips and/or lasers can be configured to operate such that light emission occurs through the substrate in a so-called "flip chip"

orientation. Such LED and/or laser chips can also be devoid of growth substrates (e.g., following growth substrate removal).

LED chips useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

LED chips can also be packaged for mechanical and environmental protection. Electrically activated light emitters, such as solid state emitters, can be used individually or in groups to emit one or more beams to stimulate emissions of one or more lumiphoric materials (e.g., phosphors, scintillators, lumiphoric inks, quantum dots) to generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LED chips having a planarized coating of phosphor integrated therewith are discussed by way of example in U.S. Patent Application Publication No. 2008/0179611 to Chitnis et al., the disclosure of which is hereby incorporated by reference herein in the entirety.

In some aspects, one or more short wavelength solid state emitters (e.g., blue and/or cyan LED chips) can be used to stimulate emissions from a mixture of lumiphoric materials, or discrete layers of lumiphoric material, including red, yellow, and green lumiphoric materials. LED chips of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175 and U.S. Patent Application Publication No. 2009/0184616), are well-known and available to persons of skill in the art.

The term "lighting apparatus" as used herein, is not limited, except that it is capable of emitting light. That is, a lighting apparatus can be a part, device, package, component, circuit element or any other apparatus for illuminating an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, or any other light emitting device.

Various illustrative features are described below in connection with the accompanying figures.

FIGS. 1A to 5 illustrate solder pads, methods, and/or systems for circuitry components utilizing solid state emitters and/or solid state lighting devices or apparatuses. FIG. 1A illustrates one embodiment of a circuitry component, generally designated 10. Circuitry component 10 can comprise any suitable circuit carrier not limited to a circuit board, a PCB, a MCPCB, flex circuitry, FR4 components, laminated circuitry, etc. Component 10 can comprise a substrate 12 and one or more electrically conductive mounting surfaces or pads disposed thereon. In some aspects, the electrically conductive mounting surfaces comprise solder pads, generally designated 14. Pads 14 are configured to physically and/or electrically attach, connect, mount, or otherwise communicate with one or more electrical components, such as a solid state lighting apparatus (e.g., $A_1$ to $A_N$, FIG. 1C). At least one solder pad 14 can be provided over substrate 12, and in some aspects a plurality of pads 14 can be provided thereon. Each solder pad 14 disposed over substrate 12 can comprise a same size (e.g., X, Y, FIG. 1B) and occupy a same surface area (e.g., defined as X by Y). Solder pads 14 comprise areas and/or surfaces of a circuit over which parts, such as solid state emitters and/or apparatuses, can be supported, mounted, attached, or otherwise disposed. Solder pads 14 comprise an anode/cathode pair adapted to pass electrical current through packaged or unpackaged light emitters for illuminating one or more objects.

Figure 1B:
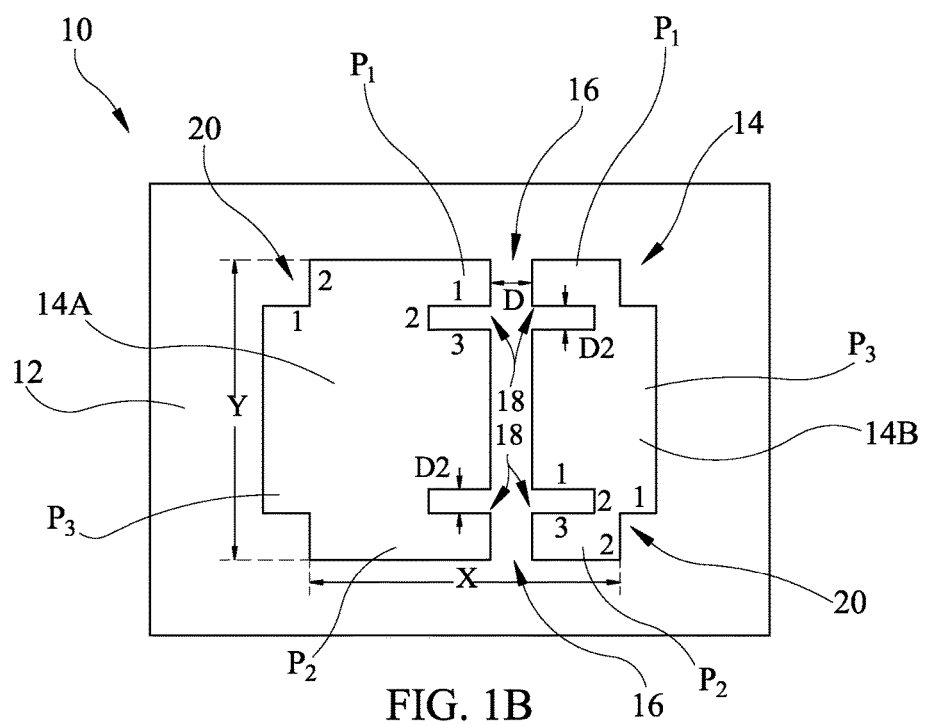
FIG. 1B is a top plan view illustrating a solder pad according to some aspects.

FIG. 1B is a top plan view illustrating solder pad 14 in more detail. Solder pad 14 comprises a first pad 14A and an opposing, second pad 14B. First and second pads 14A and 14B, respectively, can comprise substantially co-planar surfaces or portions of material over circuit carrying substrate 12. First and second pads 14A and 14B can comprise surfaces and/or layers of any electrically conductive material, for example but not limited to copper (Cu), silver (Ag), gold (Au), tin (Sn), platinum (Pt), titanium (Ti), Nickel (Ni), palladium (Pd), aluminum (Al), combinations, alloys, and/or derivatives thereof, and/or any other electrically conductive material. One of first pad 14A and second 14B comprises an anode, and the other a cathode. First and second pads 14A and 14B, respectively, collectively pass current into a circuit component, such as a light emitter device, package, or apparatus mounted thereto.

A gap 16 is disposed between first and second pads 14A and 14B, respectively, for separating the pads physically, thermally, and/or electrically. Gap 16 can comprise any suitable width dimension or distance D, for example, any distance between approximately 0.2 mm and 2 mm, such as approximately 0.2 mm, approximately 0.4 mm, approximately 0.5 mm, approximately 0.8 mm, approximately 1.0 mm, or more than approximately 1.0 mm. Gap 16 can be non-linear or substantially linear or vertical extending along a width or distance (e.g., Y) of pad 14, for example, between first pad 14A and second pad 14B.

Notably, solder pad 14 can comprise a common universal size and/or shape over which more than one size, shape, and/or design of parts such as solid state emitters or solid state lighting apparatuses can be provided. Solder pad 14 can comprise an overall length or first dimension X that can be for example any dimension between approximately 2 mm and 5 mm, such as approximately 2 mm, approximately 2.5 mm, approximately 3 mm, approximately 3.8 mm, approximately 4 mm, or more than approximately 4.5 mm. Solder pad 14 can further comprise an overall width or second dimension Y that is between approximately 2 mm and 5 mm, such as approximately 2 mm, approximately 3 mm, approximately 4 mm, or more than approximately 4.5 mm. In some aspects, solder pad 14 comprises an overall size (X by Y) of approximately 3.8 mm×3 mm, and a surface area of approximately 11 mm$^2$, for example, 11.4 mm$^2$. Notably, this size and/or shape can universally accommodate multiple different sizes, shapes, designs, and/or types of electrical components (e.g., solid state emitters and/or apparatuses) over carrier circuitry or circuit boards. Each solder pad 14 can occupy a surface area for example of approximately 9 mm$^2$ or more over substrate 12.

Each respective pad (e.g., 14A, 14B) can be separable from each other and/or separated into multiple portions by at least one shape, space, gap, channel, opening, aperture, trench, groove, and/or slot, generally designated 18 and referred to primarily herein as shape 18. In some aspects, each of first and second pads 14A and 14B, respectively, are separable and/or separated into multiple portions by multiple shapes 18 (e.g., at least a first and a second shape 18) thereby advantageously increasing an amount of edges, surfaces, surface area, and/or surface tension available for aligning parts to be soldered thereto, and for preventing misalignment and rotation of parts (e.g., circuit elements, components, solid state emitters and/or apparatuses) to be soldered thereto. Such edges can be referred to also as edges that are internal edges on each respective pad (e.g., 14A, 14B). Each shape 18 can comprise any suitable width dimension or distance $D_2$. Each shape 18 may be the same dimension or multiple dimensions $D_2$ comprising, for example, any distance between approximately 0.1 mm and 0.5 mm, such as approximately 0.15 mm, approximately 0.25 mm, approximately 0.35 mm, approximately 0.45 mm, or more than approximately 0.45 mm.

In some aspects, opposing shapes 18 of opposing first and second pads 14A and 14B, respectively, can align and form substantially linear and/or horizontal portions of material extending along length X of solder pad 14. In some aspects, shapes 18 are substantially orthogonal to gap 16. For example and in some aspects, shapes 18 and gap 16 collectively form substantially plus (+) shaped or "t-shaped" patterns about which first and second pads 14A and 14B are disposed and/or aligned. Shapes 18 and/or portions of shapes 18, which intersect or are adjacent to gap 16, can provide a plurality of surfaces or edges for increasing localized surface tension and preventing solder from flowing over or into portions of substrate 12, for improving alignment of the part to be soldered to pad 14, and/or for preventing rotation of a part with respect to pad 14, or portions thereof.

In some aspects, each pad 14A and 14B can comprise a first portion $P_1$, a second portion $P_2$, and a third, intermediate portion $P_3$. More than three or less than three portions can also be provided. First and second portions $P_1$ and $P_2$, respectfully, can each comprise a leg or an arm segment extending about a respective shape 18. In some aspects, first and second portions $P_1$ and $P_2$ of pads 14A and 14B are elongated along first X dimension, and parallel to shapes 18. First and second portions $P_1$ and $P_2$ can comprise multiple edges or surfaces, generally designated 1, 2, and 3 for providing improved alignment between solder pad and a part to be soldered thereto and/or for preventing rotation of a part over pad 14 during a soldering process. Multiple surfaces 1, 2, and 3 can also confine solder (e.g., S, FIGS. 2C, 3C, and 4C) to areas inside or defining pad 14 via surface tension, thereby preventing the solder from wetting other portions of substrate 12 outside of pad 14. Third portion $P_3$ can comprise an intermediate portion disposed between first and second portions $P_1$ and $P_2$. Reference characters 1, 2, 3, etc., are used to generally identify internal or external "edges" or "surfaces" of pad 14, and not location-specific. As described in FIGS. 2C, 3C, and 4C, pad 14 comprises multiple internal and/or external surfaces or edges, generally denoted by reference characters 1, 2, 3, etc., in each Figure, for identification of edges used to align parts to be soldered thereto.

Solder pad 14 and/or each portion thereof 14A, 14B can further comprise one or more corner notches 20. Notches 20 can also comprise multiple edges or surfaces, generally designated 1 and 2, for providing improved alignment between solder pad and a part to be soldered thereto and/or for increasing surface tension thereby preventing rotation of a part over pad 14 during a soldering process. Edges or surfaces 1 and 3 can and also confine solder (e.g., S, FIGS. 2C, 3C, and 4C) to areas inside pad 14, thereby preventing the solder from wetting other portions of substrate 12, outside of pad 14.

Solder pad 14 can be provided over or on substrate 12 using any suitable process, material, and/or technology, for example, via photo masking (e.g., utilizing photo resist, masks, and/or photo lithography) technology, etching combined with metal deposition technology, or any other suitable processing technology. In some aspects, a mask or etchant can be applied over a metallic layer for defining an outermost perimeter or border of solder pad 14. Solder pad 14 can be plated, deposited, layered, and/or physically, chemically, or plasma deposited using any suitable technique.

Notably, solder (e.g., S, FIGS. 2C, 3C, 4C) can be applied over one or more surfaces of pad 14, or portions thereof (e.g., 14A, 14B) without fully wetting the entire pad. This can allow multiple different types of devices, packages, parts and/or components to be soldered to pad 14 while conserving raw materials and improving ease of manufacture.

Figure 1C:
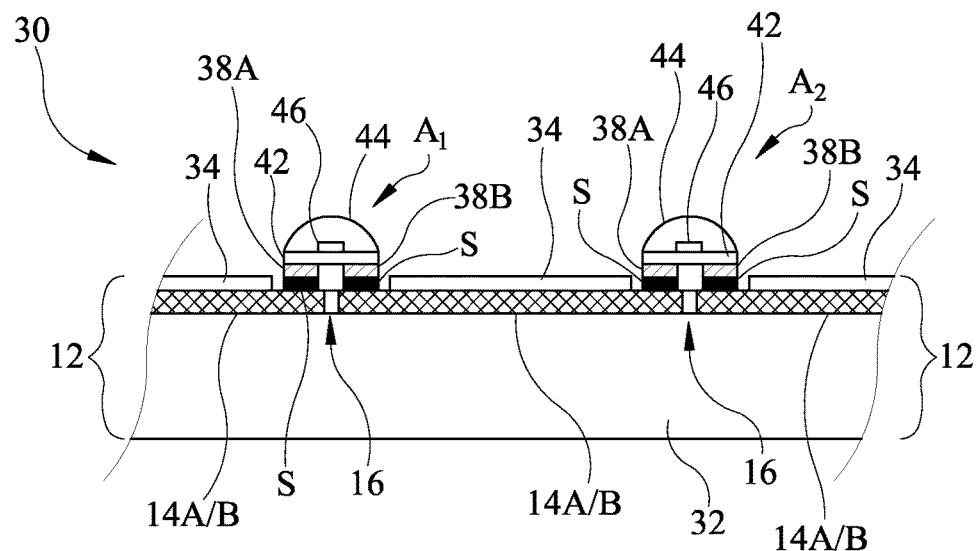
FIGS. 1C and 1D are sectional views illustrating circuitry components having solder pads according to some aspects.
Figure 1D:
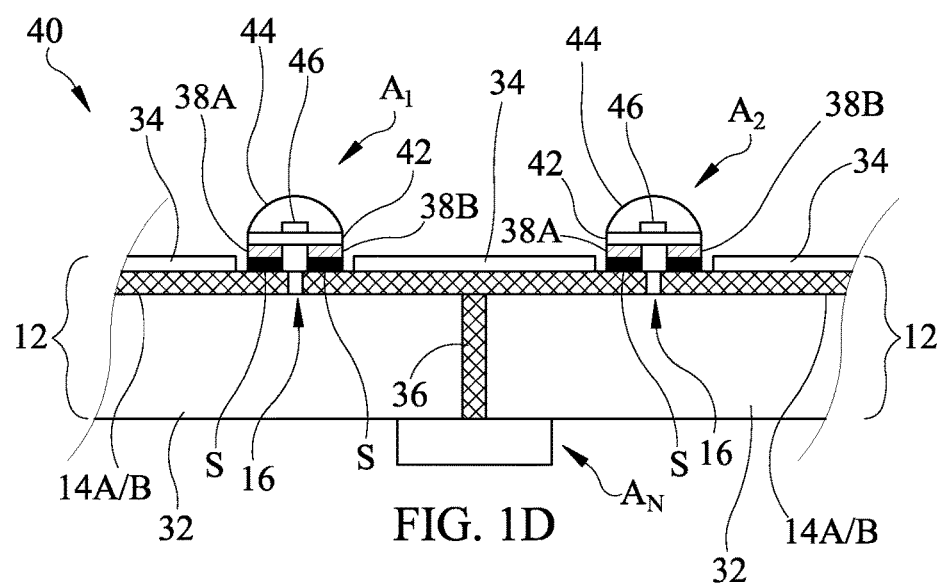

FIGS. 1C and 1D are schematic sectional views of solder pad systems, generally designated 30 and 40, respectively, each of which comprise circuitry component 10 (e.g., FIG. 1A) and one or more electrical components or apparatuses $A_1 \ldots A_N$ disposed thereon. FIGS. 1C and 1D illustrate one possible embodiment and view of substrate 12, which can comprise at least one base substrate layer 32 in addition to one or more other substrate layers. Base layer 32 can support multiple layers of circuitry, thus base layer 32 can comprise a circuit carrier in some aspects. One or more circuitry components, such as electrical apparatuses $A_1 \ldots A_N$ can also be supported by substrate 12, for example on or over base layer 32. Apparatuses $A_1 \ldots A_N$ can comprise any suitable circuit, electrical, and/or power component, for example, a solid state light emitter, a solid state lighting apparatus (e.g., device or package), a light emitting diode (LED) chip, a LED package, a resistor, a capacitor, a drive component, a transistor, a varistor, a switching component, a dimming component, a current limiting and/or rectifying component, a diode component, and/or any other electrical or circuitry component. FIG. 1C illustrates one aspect of solder pad system 30 in which apparatuses are disposed along one planar surface of substrate 12, while FIG. 1D illustrates a further aspect of solder pad system 40, in which one or more apparatuses $A_N$ can be disposed on multiple surfaces of substrate 12. In some aspects, apparatuses $A_1 \ldots A_N$ can be disposed on front, back, and/or side surfaces of substrate 12.

Base layer 32 can comprise any suitable substrate for carrying and/or supporting circuitry or circuit components. For example, base layer 32 can comprise a metal, ceramic, plastic, FR4, or any other suitable material. Base layer 32 can be electrical insulating, electrically isolating, and/or a dielectric. Any suitable material can be used as base layer 32 for supporting solder pads 14 and/or electrically apparatuses $A_1 \ldots A_N$ thereon.

First and second solder pads 14A and 14B, respectively, can be provided directly over base layer 32. First and second solder pads 14A and 14B can comprise a layer of electrically conductive material applied to base layer 32 via chemical deposition, physical deposition, plasma deposition, sputtering, plating, adhesive, or using any other application or deposition technology. Solder pad 14, and portions thereof, can comprise exposed (e.g., uncovered) portions of electrically conductive material to which one or more apparatuses can directly mount or attach. In some aspects, solder pad 14, and portions thereof, can comprise exposed layers of metal.

A material or reflective layer 34 can optionally be applied directly on and/or over solder pads 14A and 14B. In some aspects, reflective layer 34 comprises a single, monolithic layer, which can be subsequently etched for exposing pads 14. In other aspects, reflective layer 34 can be selectively applied to only cover certain areas of substrate 12 and/or in a certain pattern over substrate 12 using masking techniques. Reflective layer 34 can comprise a layer of plastic, resin, a polymeric film, a dielectric film, and/or a solder mask material. Reflective layer 34 can be configured to provide specular or diffuse reflection of light, and can comprise a white or silver "mirror-like" appearance or color for maximizing an amount of light to be reflected from substrate 12, for example, from light emitted by one or more solid state lighting apparatuses $A_1$ and $A_2$. Reflective material 34 can be etched, patterned, or otherwise formed for exposing pads 14A and 14B over base layer 32, thereby defining the outermost boundaries and, thus, the universal slotted shape of solder pad 14.

As FIG. 1D illustrates, one or more electrically conductive through-holes, vias, or conduits 36 can be provided within a portion of base layer 32. Conduits 36 are optional, and can provide optional paths for routing electrical signal between multiple apparatuses and/or between portions of substrate 12. Conduits 36 can be vertically or horizontally disposed within substrate 12, or can be disposed or positioned at any angle between vertical and horizontal, where desired.

As previously described, gaps 16 can be disposed between adjacent first and second portions of solder pad 14A and 14B, respectively. Gaps 16 can be formed via etching, masking, or any other suitable deposition and/or removal technique. In some aspects, gaps 16 are filled with a reflective material, such as solder mask. In other aspects, gaps 16 remain unfilled or devoid of material. In some aspects, gaps 16 physically and electrically separate adjacent portions of solder pad 14. In some aspects, the conductive material forming solder pad 14, and portions thereof, can be etched down to base layer 32 thereby forming gaps 16.

Still to FIGS. 1C and 1D, in some aspects, one or more solid state lighting apparatuses $A_1$, $A_2$ can optionally be serially connected over substrate 12. However, any electrical configuration of apparatuses (e.g., series, parallel, or combinations thereof) can be provided. Where serially connected, a second pad 14B of one solder pad 14 is integrally formed with a first pad 14A of another solder pad 14. In some aspects, the solder pads are adjacent, such that a plurality of solid state emitters and/or apparatuses can be serially connected, optionally in a matrix, over substrate 12. Solid state lighting apparatuses $A_1$, $A_2$ can comprise first and second electrical contacts, 38A and 38B, respectively, which can connect or mount over first and second portions of solder pad 14A and 14B, respectively, via solder S. Solder S can be applied to predefined areas of solder pad 14, or portions thereof, for example by using stencils or masks (e.g., M, FIG. 2A). Upon heating in an oven, over a hot plate, via a reflow device, or using any other suitable technique, solder S melts and flows to physically and electrically couple first and second electrical contacts 38A and 38B to portions of solder pad (e.g., 14A/B).

Solid state lighting apparatuses $A_1$, $A_2$ are schematically illustrated, and can further comprise a substrate or submount 42 for supporting an optional optical element 44 and one or more solid state emitters, such as an LED chip 46. Apparatuses $A_1$ and $A_2$ can comprise a same size and occupy a same surface area (e.g., of submount 42) of substrate 12 and/or solder pad 14, or each apparatus $A_1$ and $A_2$ can comprise a different size and occupy a different surface area of substrate 12 and/or solder pad 14. Submount 42 can comprise any suitable material such as, for example, ceramic or plastic, from which electrical contacts 38A and 38B can extend and/or protrude. In some aspects, electrical contacts 38A and 38B are applied to submount 42 via adhesive, and electrically communicate with LED chip 46 via conduits or electrically conductive vias. In other aspects, electrical contacts 38A and 38B comprise traces or contact pads. In further aspects, electrical contacts 38A and 38B comprise leadframe segments or "leads". Solid state lighting apparatuses $A_1$, $A_2$ can comprise any suitable type of device, such as a surface mount design (SMD) type of light emitter package. Optical element 44 can provide physical and environmental protection for LED chip 46. Optical element 44 and/or LED chip 46 can optionally be coated with an optical conversion material (not shown) such as a phosphor or lumiphor. Any type of solid state lighting apparatus or apparatuses, not limited to LED packages, is contemplated. Notably, solder pad 14 is configured to support a plurality of different sizes, shapes, and/or designs of solid state lighting apparatuses, in addition to improving operability of the apparatuses by improving alignment thereof. Solder pad systems described herein can be used in circuit carriers for attachment to devices having various different sized footprints. Notably, the devices having different sized footprints can be attached, mounted, and/or soldered to a commonly sized/shaped/designed solder pad having a common (e.g., same size) footprint.

Figure 2A:
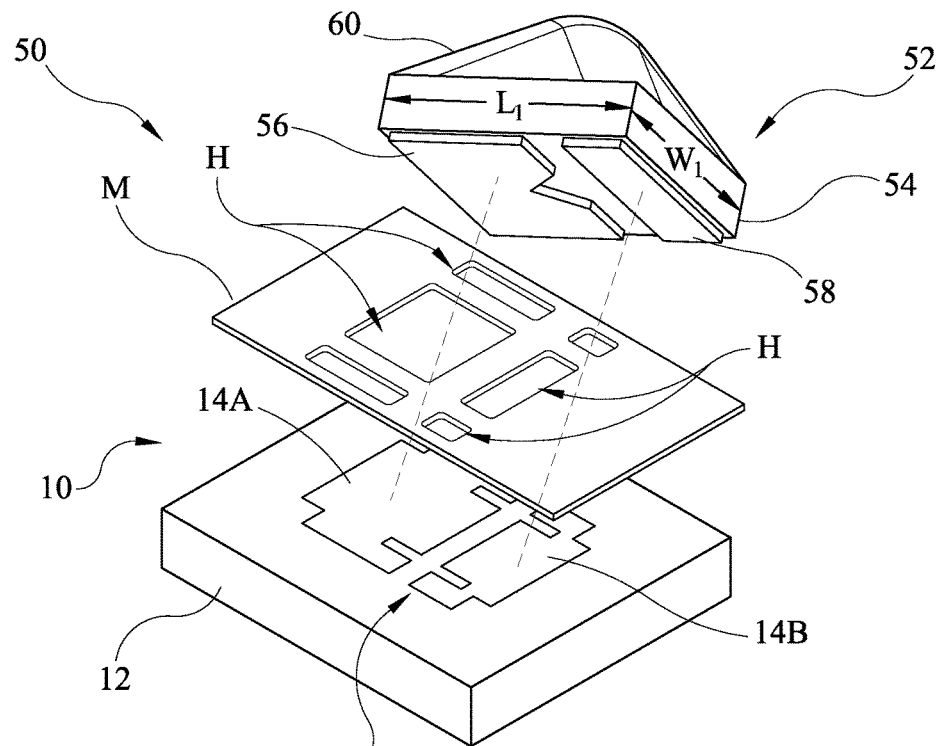
FIGS. 2A and 2B are exploded overlaid views illustrating a solder pad system according to some aspects.

FIGS. 2A to 4C illustrate various aspects of solder pad systems and related methods, for use with solid state lighting apparatuses. FIGS. 2A, 3A, and 4A, respectively, illustrate various embodiments of solid state emitters and/or packages or components for provision over solder pad 14. Although three different embodiments of light emitters/apparatuses are shown, more than three types can be provided and soldered to solder pad 14. However, in efforts to conserve illustrations, only three different solid state apparatuses are illustrated. Notably, solder pad 14 is configured for physical and electrical communication with multiple, at least two, at least three, and/or more than three different types and/or sizes of solid state lighting apparatus. In some aspects, a plurality of different types of apparatuses (e.g. 52, 72, and 92, FIGS. 2A, 3A, and 4A, respectively) can utilize a common solder pad (e.g., 14, FIG. 1A) and be disposed over a same circuit board comprising a plurality of same sized solder pads 14. Each apparatus (e.g. 52, 72, and 92, FIGS. 2A, 3A, and 4A, respectively) can comprise different sizes, and be configured to occupy different surfaces areas with respect to pad 14.

FIG. 2A illustrates a solder pad system, generally designated 50. Solder pad system 50 comprises circuitry component 10 (FIG. 1A) and a part to be soldered thereto. In some aspects, the part to be soldered thereto comprises a solid state light emitter package, device, and/or apparatus, generally designated 52. Circuitry component 10 comprises a substrate 12 and solder pad 14. Solder pad 14 is configured to correspond to a portion of apparatus 52.

Apparatus 52 can comprise a substrate or submount 54 over which at least one solid state emitter (e.g., 46, FIG. 1C) can be supported and/or mounted. Solid state emitters can comprise at least one LED chip. One or more surface mount contact pads 56 and 58 can extend from a bottom portion of submount 54 for receiving electrical current and passing the current into the at least one LED chip using conductive through holes, vias, or any other trace configuration. A lens 60 can be provided over apparatus 52 for providing mechanical, chemical, and/or environmental protection of LED chips (e.g., 46, FIG. 1C) disposed therein.

Submount 54 can comprise any suitable size and/or shape configured to support at least one, or multiple LED chips (e.g., 46, FIG. 1C). LED chips can be configured to emit primarily blue, green, or red light, and in some aspects, combinations thereof. Portions of LED chips and/or apparatus 52 can be coated or layered with optical conversion material, such as phosphor. In some aspects, phosphor is configured to emit blue, green, yellow, or red light upon impingement with light from the at least one LED chip. In some aspects, submount 54 comprises a length $L_1$ and a width $W_1$ of at least approximately 2 mm×2 mm, 3 mm×3 mm, or more than 4 mm×4 mm. In some aspects, submount 54 is approximately 3 mm×3 mm and occupies a surface area of at least approximately 9 mm².

In some aspects, solder is selectively applied to portions of solder pad 14. For example and in some aspects, a stencil, template, and/or mask M can be used to apply solder (e.g., S, FIG. 2C). Mask M allows solder S (FIG. 2C) to only be applied to predetermined, designated areas of solder pad 14. Mask M can comprise one or more openings, apertures, or holes H, though which solder S (FIG. 2C) can be stenciled, deposited, or otherwise applied. Solder S (FIG. 2C) can be selectively applied to any portion of solder pad 14, such that upon heating, apparatus 52 can physically and electrically connect to solder pad 14 and substrate 12 of component 10. As the broken lines in FIG. 2A illustrate, first and second contacts 56 and 58 can be configured to align over and connect to first and second pads 14A and 14B of solder pad 14, respectively. First and second contacts 56 and 58 and first and second pads 14A and 14B can comprise anode/cathode pairs across which electrical current can be applied for illuminating apparatus 52.

Figure 2B:
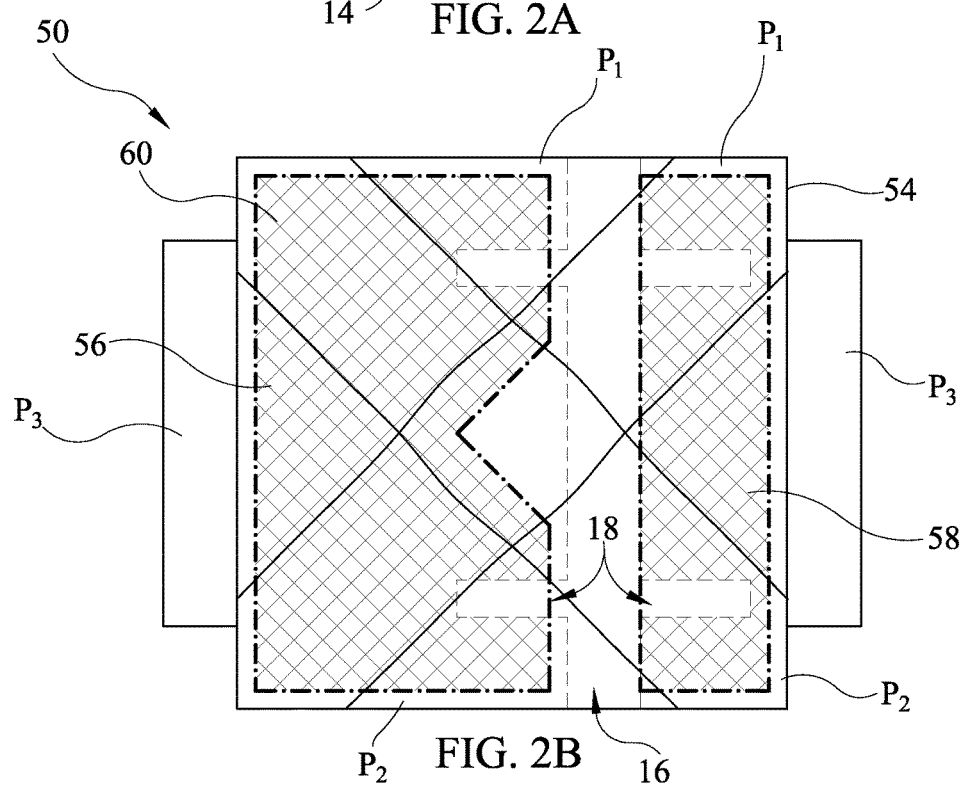

FIG. 2B is a schematic top plan view illustrating one embodiment of overlap occurring between solid state lighting apparatus 52 and solder pad 14, or more specifically, electrical contacts 56, 58 of apparatus 52 and solder pad 14. The solid lines in FIG. 2B illustrate outermost, lateral edges of (e.g., the footprint) of submount 54. The solid and broken lines, collectively, also illustrate the outermost lateral edges (e.g., the footprint) of solder pad 14, as can be appreciated by labeled portions $P_1$, $P_2$, and $P_3$. The dot-dash ("•-•") lines illustrate the outermost lateral edges (e.g., the footprints) of contacts 56 and 58. The hatched areas in FIG. 2B illustrate areas of overlap occurring between contacts 56, 58 and portions of solder pad 14, respectively. As FIG. 2B illustrates, the entire top portion or surface of solder pad 14 is not wet by solder and/or connected to apparatus 52 In some aspects, at least some (e.g., outermost) portions $P_3$ of solder pad are devoid of solder, and are not physically or electrically connected to apparatus 52 and/or contacts 56, 58 thereof.

Figure 2C:
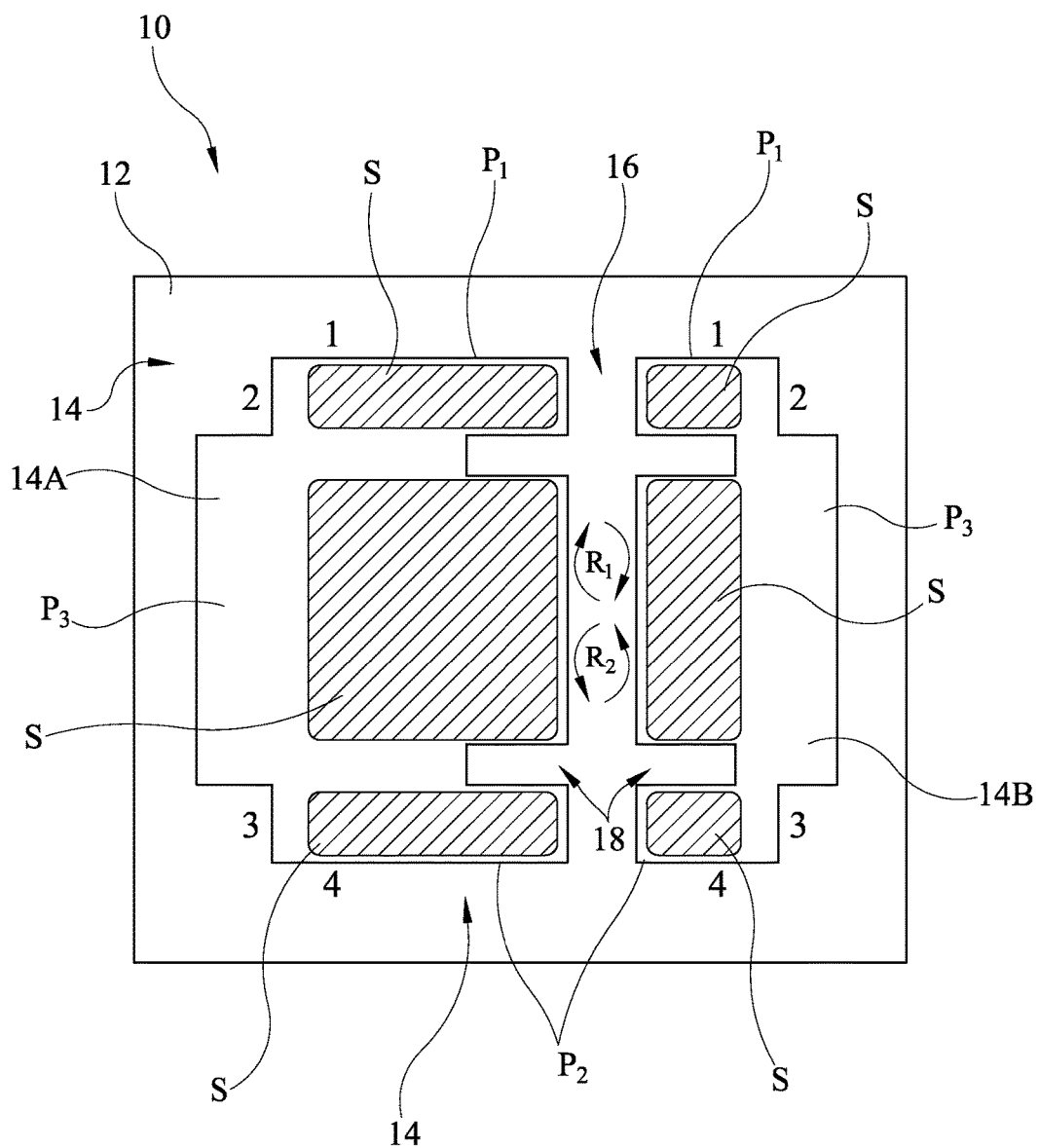
FIG. 2C is an overlaid view illustrating solder locations over solder pads according to some aspects.

FIG. 2C illustrates a pattern of solder S as applied to solder pad 14. Solder S may be applied on, over, and/or through portions of a mask (e.g., M, FIG. 2A). Solder S at least partially wets solder pad 14. As FIG. 2C illustrates, solder pad 14 (e.g., and portions 14A and 14B thereof) comprises multiple surfaces, edges, generally designated 1, 2, 3, and 4, and/or an increased surface area adapted to retain solder S over pad 14 and/or to prevent sliding or rotation of a part to be soldered thereto. For example, clockwise sliding or rotation $R_1$ and/or counterclockwise sliding or rotation $R_2$ is prevented by applying solder S about one or more shapes 18. Shapes 18 comprise multiple external surfaces or edges 1, 2, and/or 3 for locally increasing surface tension of solder S, thereby preventing rotation (e.g., $R_1$ and/or $R_2$) of a part as it is soldered on or over pad 14. In some aspects, external edges 1, 2, 3, and 4 collectively form portions of an outer perimeter of solder pad 14, including notches N (FIG. 1B) disposed therein.

Figure 3A:
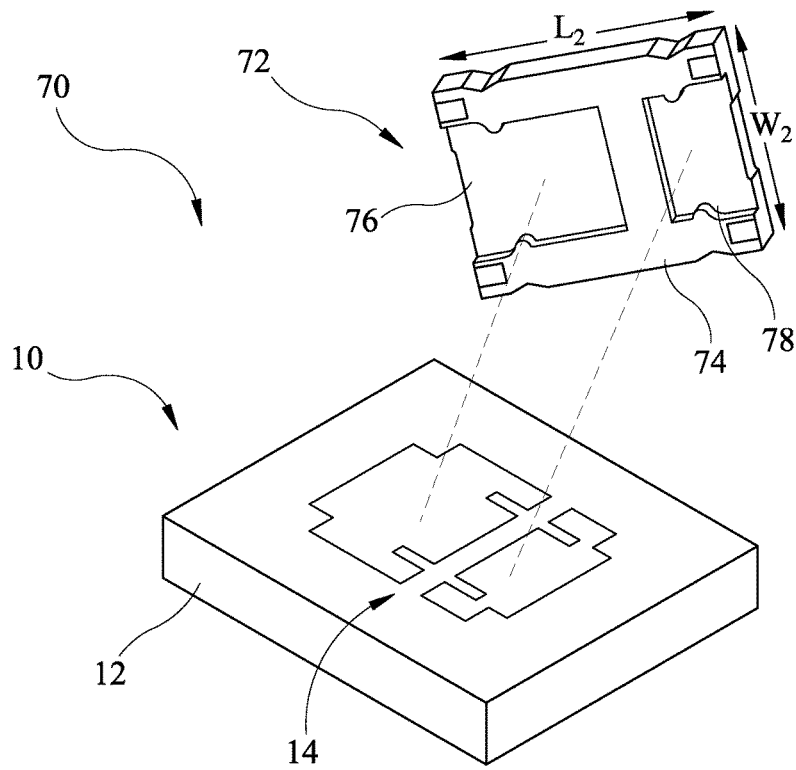
FIGS. 3A and 3B are exploded and overlaid views illustrating a further embodiment of a solder pad system according to some aspects.

FIG. 3A illustrates another embodiment of a solder pad system, generally designated 70. Solder pad system 70 comprises circuitry component 10 and a part to be soldered thereto. In some aspects, the part to be soldered thereto comprises a solid state light emitter package, device, and/or apparatus, generally designated 72. Circuitry component 10 comprises a substrate 12 and solder pad 14. Solder pad 14 is configured to correspond to various sizes, shapes, and/or designs of circuit components, not limited to solid state lighting apparatus 72.

Apparatus 72 can comprise a submount 74 over which at least one solid state emitter (e.g., 46, FIG. 1C) can be supported and/or mounted. Solid state emitters can comprise at least one LED chip. One or more electrical leads, such as surface mount contact pads 76 and 78 can extend from a bottom portion of submount 74 for receiving electrical current and passing the current into the at least one LED chip using conductive through holes, vias, or any other trace configuration. An optical element, such as a lens, encapsulant, plastic, resin, etc., can be provided over apparatus 72 for providing mechanical, chemical, and/or environmental protection to an LED chip and/or chips provided therein.

In some aspects, submount 74 comprises a length $L_2$ and a width $W_2$ of at least approximately 3 mm×2 mm, 3.5 mm×3 mm, or more than 4 mm×4 mm. In some aspects, submount 74 is approximately 3.5 mm×2.8 mm and occupies a surface area for example of at least approximately 9.8 mm². Submount 74 can comprise any square, rectangle, non-square, and/or non-rectangular shape. Devices and corresponding submounts described herein can be, but do not have to be, symmetrical about at least one axis of symmetry. Asymmetrical devices having asymmetrical submounts can also be provided.

A stencil, template, and/or mask M (FIG. 2A) can be used to selectively apply solder (e.g., S, FIG. 3C) to portions of solder pad 14. As the broken lines in FIG. 3A illustrate, first and second contacts 76 and 78 are configure to align over and physically/electrically connect to first and second pads 14A and 14B (FIG. 1B) of solder pad 14, respectively.

Figure 3B:
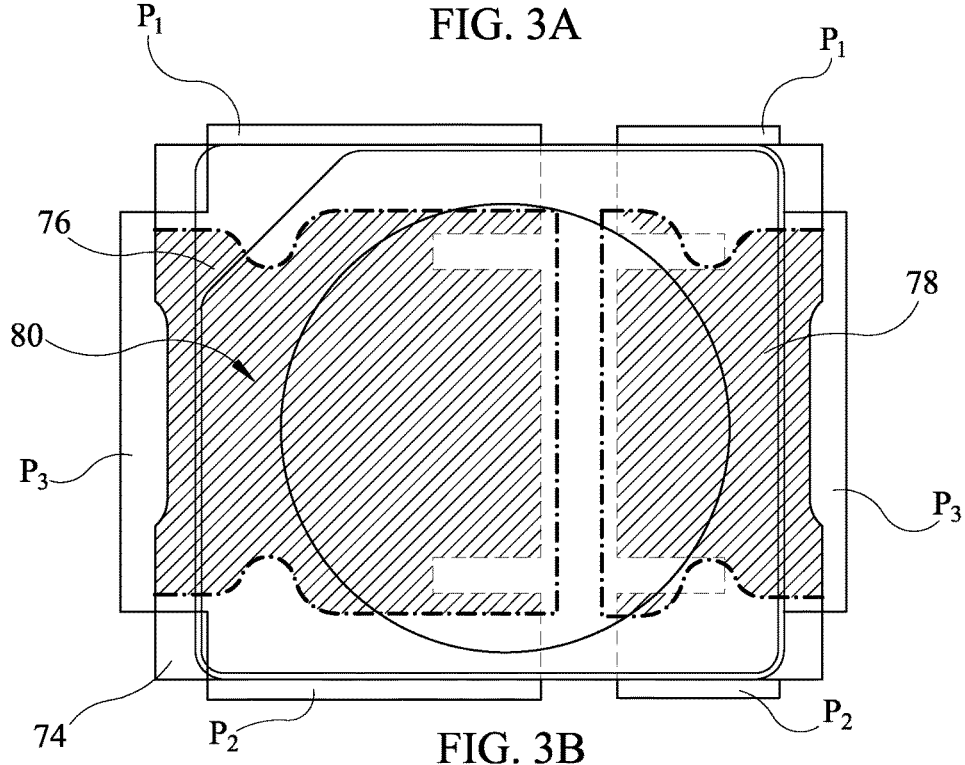

FIG. 3B is a schematic top plan view illustrating the overlap between solid state lighting apparatus 72 and solder pad 14, or more specifically, electrical contacts 76, 78 of apparatus 72 and solder pad 14. The dot-dash ("•-•") lines illustrate the outermost lateral edges of contacts 76 and 78. The hatched areas illustrate areas of overlap between contacts 76, 78 and portions of solder pad 14, respectively. Solder pad 14 may not be fully wet by solder and/or connected to apparatus 72 As FIG. 3B illustrates and in some aspects, at least some portions $P_1$, $P_2$, and/or outermost portions of $P_3$ of solder pad 14 are devoid of solder, and not physically or electrically connected to apparatus 72 and/or contacts 76, 78 thereof.

A top plan view of apparatus 72 in FIG. 3B also illustrates positioning of a light emitting portion 80 thereof. Light emitting portion 80 can comprise one or more LED chips disposed within an optical element, such as encapsulant, as shown and described in commonly assigned and U.S. Pat. No. 8,564,000, filed on Feb. 16, 2011, the entire content of which is fully incorporated by reference herein. Light emitting portion 80 can also comprise a reflective structure disposed about the LED chips, such as a reflective retaining structure, member, or dam.

Figure 3C:
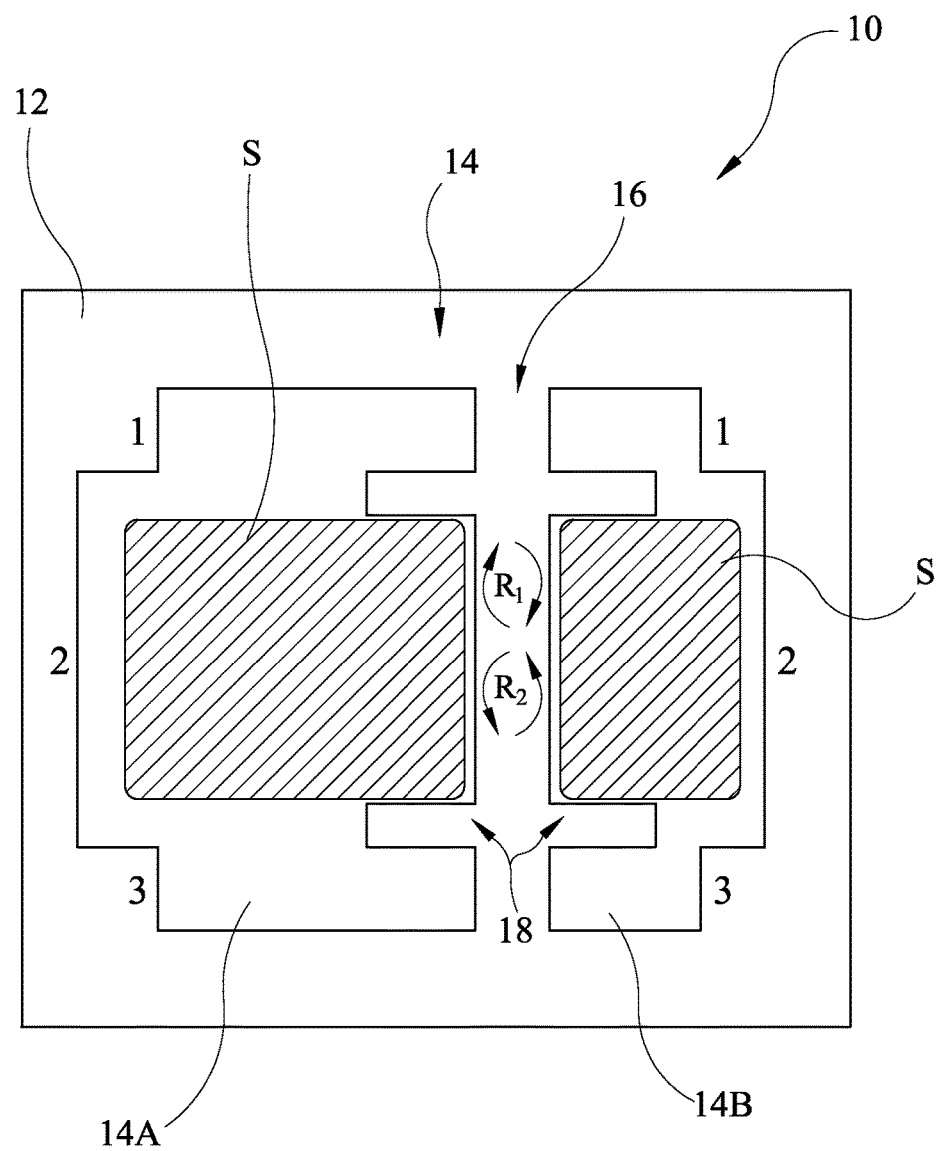
FIG. 3C is an overlaid view illustrating solder locations over solder pads according to some aspects.

FIG. 3C illustrates a pattern of solder S as applied to solder pad 14 for connecting apparatus 72 (FIG. 3A) thereto. Solder S may be applied on, over, and/or through portions of a stencil or mask (e.g., M, FIG. 2A). Solder S can at least partially wet solder pad 14. As FIG. 3C illustrates, solder pad 14 (i.e., and portions 14A, and 14B thereof) comprises multiple surfaces or edges, generally designated 1, 2, and 3, at which solder has an increased surface area for retaining solder S over pad 14 and/or to prevent rotation and/or sliding of a part to be soldered thereto. For example, clockwise rotation $R_1$ and/or counterclockwise rotation $R_2$ of any part (e.g., 72) with respect to solder pad 14 is prevented by applying solder S about one or more shapes 18. Shapes 18 comprise multiple internal and/or external edges 1, 2, and/or 3 at which a localized surface tension within solder S increases for preventing rotation (e.g., $R_1$ and/or $R_2$) and/or sliding of a part over pad 14. In some aspects, edges 1, 2, and 3, collectively form portions of an outer perimeter of solder pad 14, including notches N (FIG. 1B) disposed therein. Internal edges of pad 14 (e.g., defining shape 18) can also be used for preventing rotation and aligning parts over solder pad.

Figure 4A:
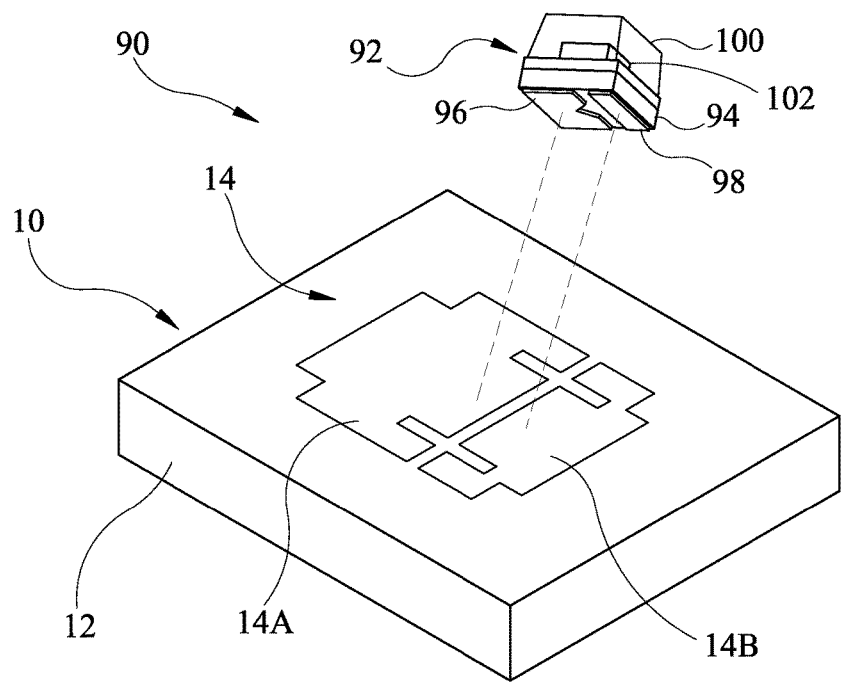
FIGS. 4A and 4B are exploded and overlaid views illustrating a further embodiment of a solder pad system according to some aspects.

FIG. 4A illustrates a further embodiment of a solder pad system, generally designated 90. Solder pad system 90 comprises circuitry component 10 and a part to be soldered thereto. In some aspects, the part to be soldered thereto comprises a solid state light emitter package, device, and/or apparatus, generally designated 92. Circuitry component 10 comprises a substrate 12 and solder pad 14. Solder pad 14 is configured to correspond to various sizes, shapes, and/or designs of circuit components, not limited to apparatus 92.

Apparatus 92 can comprise a submount 94 over which at least one solid state emitter can be supported and/or mounted. Solid state emitters can comprise at least one LED chip 102. One or more electrically conductive portions of apparatus 92, such as surface mount contact pads 96 and 98 can extend from a bottom portion of submount 94 for receiving electrical current and passing the current into LED chip 102 using conductive through holes, vias, and/or any other trace configuration. An optical element 100, such as a lens, encapsulant, plastic, resin, etc., can be provided over apparatus 92 for providing mechanical, chemical, and/or environmental protection to an LED chip and/or chips provided therein.

In some aspects, submount 94 has a length and a width of at least approximately 1 mm×1 mm, 2 mm×2 mm, or more than 3 mm×3 mm. Submount 94 can have a smaller length, width, and/or surface area as compared to apparatuses 52 and 72, which can also advantageously be supported by a common solder pad 14 also adapted to support larger apparatuses as described above. In some aspects, submount 94 is approximately 1.6 mm×1.6 mm and occupies a surface area of at least approximately 2 mm$^2$, for example, at least approximately 2.56 mm$^2$.

A stencil, template, and/or mask M (FIG. 2A) can be used to apply solder (e.g., S, FIG. 4C) to portions of solder pad 14. As the broken lines in FIG. 4A illustrate, first and second contacts 96 and 98 are configure to align over and connect to inboard regions of opposing first and second pads 14A and 14B (FIG. 1B) of solder pad 14, respectively.

Figure 4B:
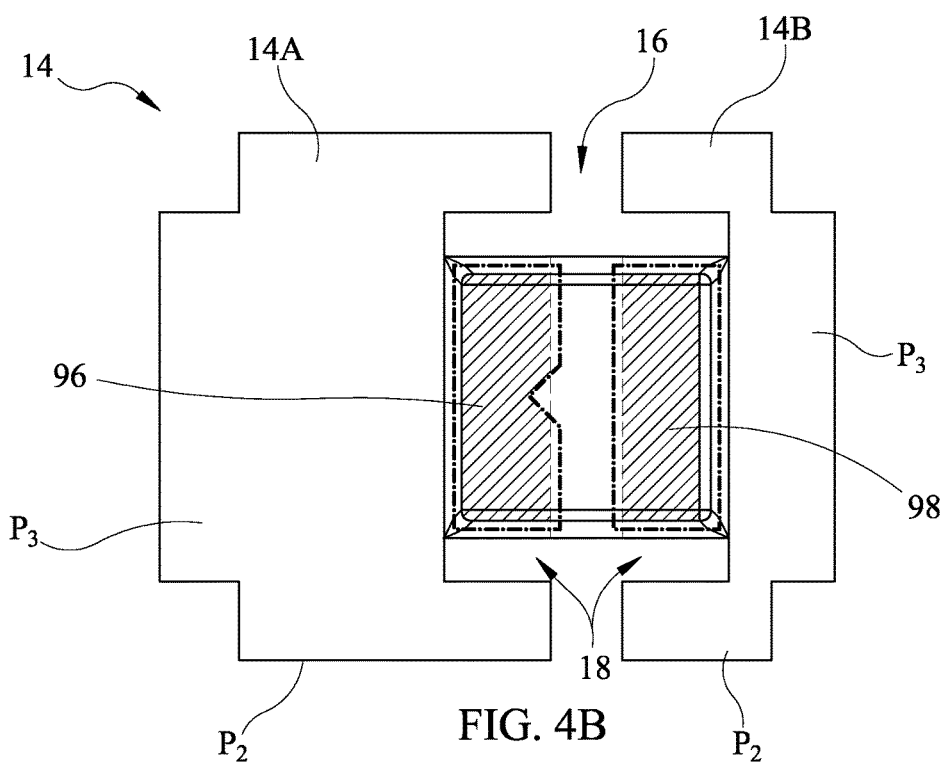

FIG. 4B is a schematic, top plan view illustrating the overlap between solid state lighting apparatus 92 and solder pad 14, or more specifically, electrical contacts 96, 98 of apparatus 92 and solder pad 14. The dot-dash ("•-•") lines illustrate the outermost lateral edges or footprint of contacts 96 and 98. The hatched areas illustrate overlap between contacts 96, 98 and portions of solder pad 14, respectively. In some aspects, at least some portions $P_1$, $P_2$, and/or intermediate portions of $P_3$ of solder pad 14 are devoid of solder, and not physically or electrically connected to apparatus 92 and/or contacts 96, 98 thereof.

Figure 4C:
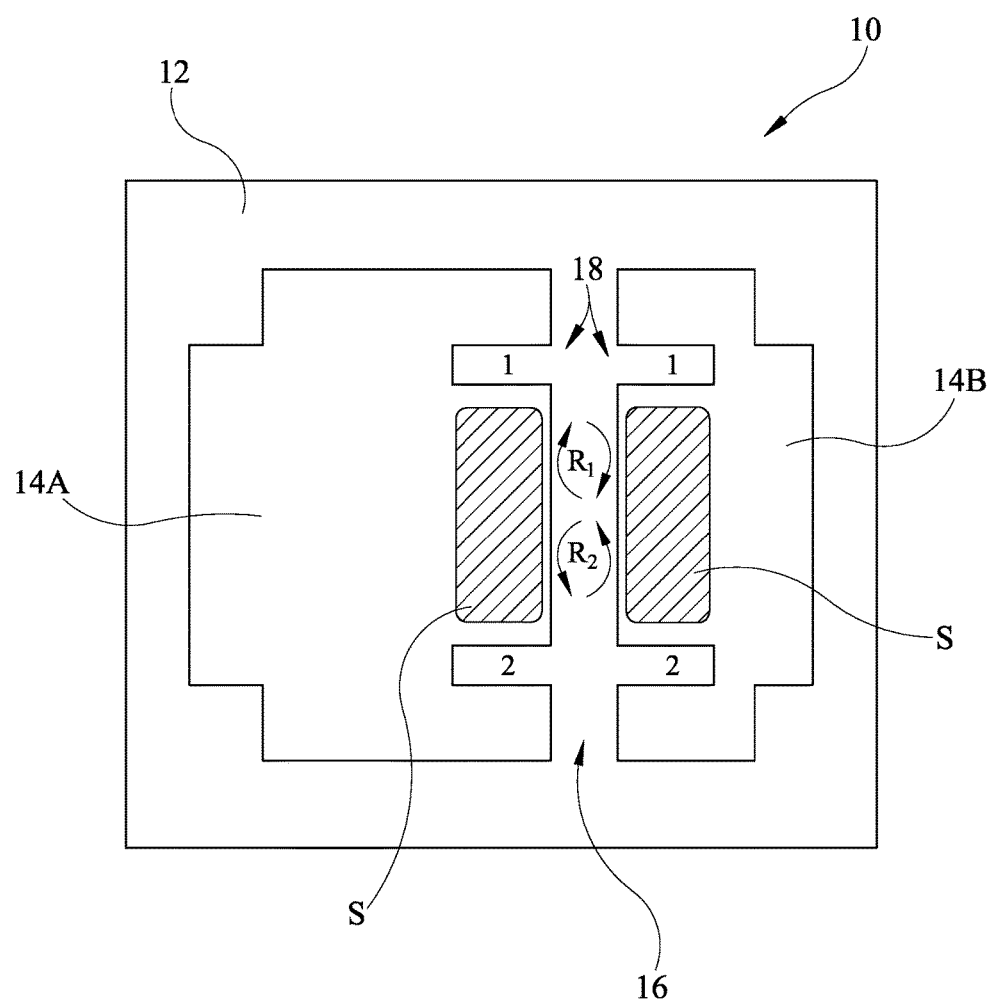
FIG. 4C is an overlaid view illustrating solder locations over solder pads according to some aspects.

FIG. 4C illustrates a pattern of solder S as applied to solder pad 14 for connecting apparatus 92 (FIG. 4A) thereto. Solder S may be applied on, over, and/or through portions of a mask (e.g., M, FIG. 2A) to at least partially wet solder pad 14. As FIG. 4C illustrates, solder pad 14 comprises multiple surfaces or edges (e.g., 1, 2) and/or an increased surface area adapted to retain solder S over pad 14 and/or to prevent rotation of a part to be soldered thereto. For example, clockwise rotation $R_1$ and/or counterclockwise rotation $R_2$ of any part (e.g., 92) with respect to solder pad 14 is prevented by applying solder S about one or more shapes 18. Shapes 18 can comprise multiple internal edges 1 and 2 for preventing rotation (e.g., $R_1$ and/or $R_2$) and/or sliding of a part with respect to pad 14. Edges 1 and 2 can comprise internal edges defining shape 18.

Figure 5:
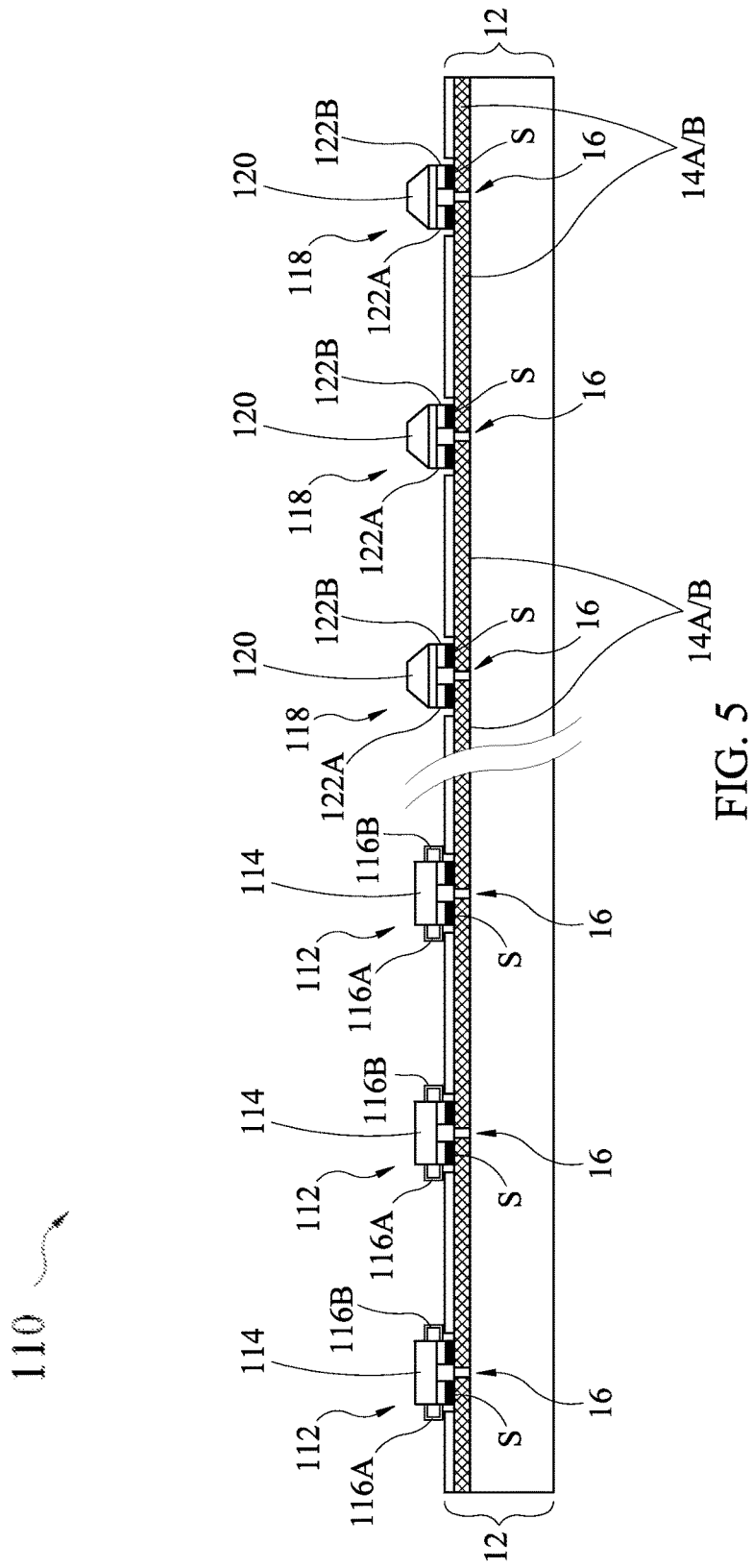
FIG. 5 is a further embodiment of a solder pad system according to some aspects.

FIG. 5 is a further embodiment of a solder pad system, generally designated 110, according to some aspects. System 110 can comprise substrate 12 and one or more electrically conductive mounting surfaces or pads 14A, 14B disposed thereon as described above. One or more gaps 16 are provided between adjacent pads 14A and 14B, as described above. Pads 14A and 14B can comprise an anode/cathode pair and collectively form a solder pad (e.g., 14, FIG. 1B) for attaching to a plurality of different parts. Substrate 12 can comprise any suitable surface or structure for supporting or carrying circuit elements and/or circuitry components, such as a PCB, a MCPCB, an FR4 laminate, etc. Solder pad 14 is configured to correspond to a portion of a solid state lighting apparatus, generally designated 112 and/or a solid state light emitter or LED chip, generally designated 118.

Solid state lighting apparatus 112 can comprise a body 114 and one or more electrical contacts 116A and 116B extending therefrom. Electrical contacts 116A and 116B can comprise, for example, electrical "leads" (e.g., portions of a leadframe) extending from package body 114. Package body 114 can comprise a ceramic or a molded plastic body that is, in some aspects, at least partially disposed about contacts 116A and 116B. Contacts 116A and 116B can comprise an anode cathode pair configured to physical and electrically attach to pads 14A and 14B via solder S.

As described above and in some aspects, one or more solid state light emitters, such as one or more LED chips 118

(e.g., LED chips) can also be directly disposed over solder pads and/or systems described herein. For example, one or more chip-on-board (COB) LED chips 118 can be provided directly over the solder pads (e.g., 14, FIG. 1B) comprised of pads 14A and 14B to which various different parts (e.g., chips and/or packages) can mount or connect.

In some aspects, LED chips 118 can each comprise a body 120 and first and second electrical contacts, generally designated 122A and 122B extending therefrom. Contacts 122A and 122B can comprise, for example, an anode and a cathode pair by which electrical current can flow into and illuminate chip. Contacts 122A and 122B can mount directly to solder pad 14 (FIG. 1B) via solder S, such that no intervening submount is disposed therebetween. Contacts 122A and 122B can be disposed on a same surface (e.g., an upper/lower surface) or on different surfaces of body 120. Exemplary LED chips are shown and described in commonly owned and assigned co-pending U.S. application Ser. No. 14/053,404, filed on Oct. 14, 2013, the disclosure of which is hereby incorporated by reference herein in the entirety. For example, wafer lever chips, flip-chips, and/or unpackaged (e.g., submount-free) LED chips can comprise anode/cathode terminals configured to directly attach to first and second pads 14A, 14B of solder pads and systems described hereinabove. The term "submount free" is defined as a component with no intervening submount between the chip and the external anode/cathode of the component.

Figure 6:
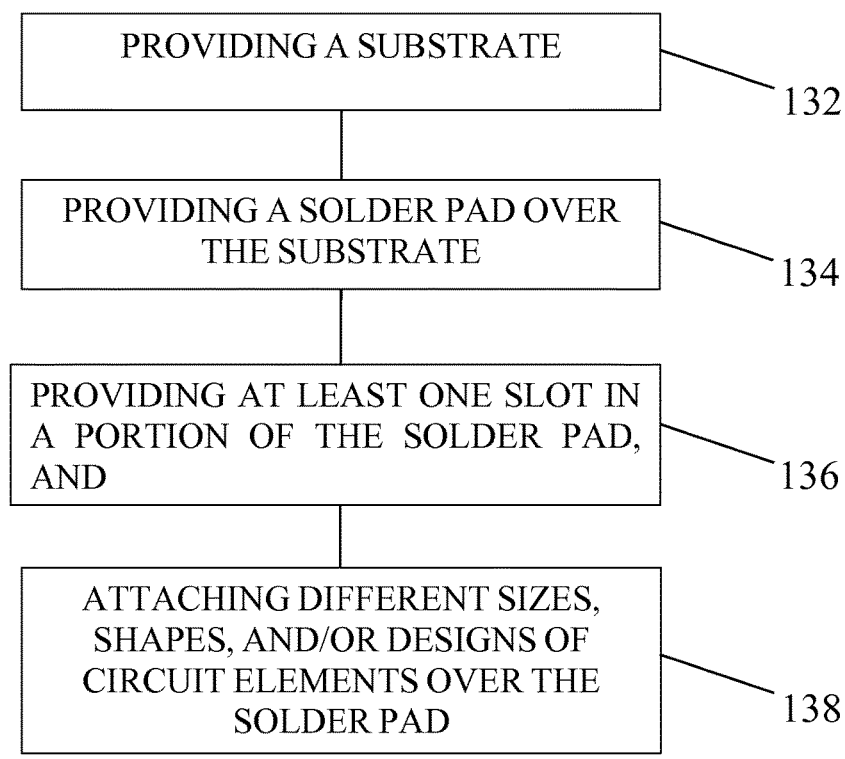
FIG. 6 is a block diagram illustrating an exemplary method relating to solder pads and/or solder pad systems according to some aspects.

FIG. 6 is a block diagram illustrating an exemplary method, generally designated 130, associated with solder pads and systems described herein. In block 132, a substrate can be provided. The substrate can comprise any suitable circuit carrying substrate, such as, for example, a circuit board, a PCB, a MCPCB, flex circuitry, an FR4 board, or a layer of material comprised of ceramic, metallic traces, and/or dielectric materials. Any suitable substrate can be provided.

In block 134, a solder pad can be provided over the substrate. One solder pad or a plurality of solder pads can be provided over substrate. Each solder pad can comprise a same size and/or occupy a same surface area of substrate. Notably, solder pad comprises a common pad over which multiple differently sized, shaped, and/or designed circuit elements can be provided (e.g., mounted or attached). Solder pads can comprise exposed portions of the circuit carried by the substrate, over which circuit elements can mount. Solder pads can be provided via masking technology, metal etching/deposition technologies, sputtering, plating, etc. Any suitable method can be used to apply and/or form solder pads over a substrate.

In block 136, at least one shape is provided in a portion of the solder pad. The shape is configured to increase a number of edges and/or surface area for improving the alignment of a part (e.g., circuit element) with respect to solder pad. The increased edges can increase surface tension within a solder, thus, preventing parts from rotating and/or sliding over the substrate and/or solder pad during a soldering process. Solder can be applied to predetermined and/or selective regions of the solder pad (e.g., via a stencil or mask) prior to placement of a part over the solder pad.

In block 138, different sizes, shapes, and/or designs of circuit elements can be attached to the solder pad. Circuit elements can comprise any suitable circuitry component, for example, a solid state light emitter, a solid state lighting apparatus (e.g., 52, 72, 92 above), a light emitting diode (LED) chip, a LED package, a resistor, a capacitor, a drive component, a transistor, a varistor, a switching component, a dimming component, a current limiting and/or rectifying component, a diode component, and/or any other electrical or circuitry component. Solder can be provided and disposed between the solder pad and circuit elements. The parts can be heated so that the solder melts and then hardens, thereby physically and electrically connecting the circuit element to the solder pad.

Solder pads, systems, and methods as disclosed herein can provide, for example and without limitation, one or more of the following beneficial technical effects: reduced cost; improved manufacturability; universal support, electrical connection, and/or physical connection to multiple light emitter devices and/or circuitry components via a universally sized and/or shaped solder pad. In some aspects, a device for a light emitter comprises a substrate and a plurality of electrically isolated pads supported by the substrate as the pads are configured for separately attaching a plurality of different electrical components to the pads. The pads are configured for separately attaching a plurality of different electrical components to the pads with application of solder only under portions of the different electrical components and without application of solder to areas of the pads that would not be covered by the different electrical components. For example, an anode and cathode pair of the pads can attach to a surface-mount ceramic component, a submount-free component, a leadframe component and/or a chip on board component. The pads are configured for separately attaching a plurality of different electrical components to the pads where the electrical components can be light emitting diode (LED) components. A method of attaching an electrical component to a substrate is evident, the method comprising selectively attaching one of a plurality of electrical components to a plurality of isolated pads supported by a substrate where the pads are configured for separately attaching a plurality of different electrical components to the pads.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A solder pad for attaching to a plurality of different parts, the solder pad comprising:
    a first pad having a first surface area;
    a second pad having a second surface area that is greater than the first surface area; and
    a gap disposed between the first pad and the second pad, wherein the first pad and the second pad each comprise a first edge and a second edge,
    wherein the first edge of each of the first and second pads is an innermost edge closest to the gap, wherein the second edge of the first pad is an outermost edge of a total surface area of the solder pad that is a farthest distance away from the gap, wherein the second edge of the second pad is an outermost edge of the total surface area of the solder pad that is a farthest distance away from the gap, wherein each of the first edges comprises at least one slot, with an outer slot edge, wherein each of the second edges comprises at least one notch disposed in an outermost corner thereof for increasing a number of edges available to align at least one part to be soldered thereto, wherein the at least one notch comprises a first notch edge and a second notch edge, wherein the first notch edge is collinear with the outer slot edge, wherein the second notch edge is orthogonal to the outer slot edge and has a width less than an overall width of the solder pad, and wherein an edge of the at least one slot is coplanar with the first edge in which the edge is formed, such that the edge is surrounded on both sides by the first edge.

2. The solder pad according to claim 1, wherein the at least one slot is substantially orthogonal to the gap.

3. The solder pad according to claim 1, wherein the first and second edges are substantially parallel to the gap, wherein the at least one slot comprises multiple slots, and wherein the at least one notch comprises multiple notches.

4. The solder pad according to claim 1, wherein the first and second pads comprise different shapes.

5. The solder pad according to claim 1, wherein the gap comprises a width that is between approximately 0.2 millimeters (mm) and 2 mm.

6. The solder pad according to claim 1, wherein the first and second pads have an overall width that is between approximately 2.0 millimeters (mm) and 5.0 mm.

7. The solder pad according to claim 1, wherein the solder pad is disposed over a circuit board.

8. The solder pad according to claim 1, wherein a solid state lighting device is disposed over the solder pad.

9. A solder pad system for facilitating attachment to a plurality of different parts, the system comprising:
a substrate;
a plurality of solder pads disposed over the substrate, wherein each of the plurality of solder pads comprises a same footprint occupying a same surface area of the substrate, wherein each of the plurality of solder pads comprises:
a first pad having a first shape;
a second pad having a second shape that is different than the first shape; and
a gap separating the first pad and the second pad,
wherein the first pad and the second pad each comprises a first edge and a second edge,
wherein the first edge is an innermost edge of each shape closest to the gap,
wherein the second edge is an outermost edge of a total surface area of a respective one of the plurality of solder pads that is farthest from the gap,
wherein each of the first edges comprises at least one slot having at least one slot edge,
wherein each of the second edges comprises at least one notch disposed in an outermost corner thereof;
wherein the at least one notch comprises a first notch edge and a second notch edge,
wherein the first notch edge is collinear with the at least one slot edge, wherein the second notch edge is orthogonal to the at least one slot edge and has a width less than an overall width of the respective one of the plurality of solder pads, and wherein an edge of the at least one slot is coplanar with the first edge in which the edge is formed, such that the edge is surrounded on both sides by the first edge; and a plurality of circuit elements disposed over the plurality of solder pads, wherein the plurality of circuit elements comprises at least two different footprint sizes, footprint shapes, and/or footprint designs occupying different surface areas of the substrate.

10. The solder pad system according to claim 9, wherein the first and second pads each comprise a plurality of slots disposed therein, increasing a number of edges available to align at least one part to be soldered thereto, and wherein each of the plurality of slots is oriented substantially orthogonal to the gap.

11. The solder pad system according to claim 9, wherein the plurality of circuit elements comprises a plurality of solid state lighting devices.

12. The solder pad system according to claim 9, wherein the substrate comprises a circuit board.

13. A method of providing a solder pad for attaching a plurality of different circuitry components thereto, the method comprising:
providing a substrate;
forming a solder pad on the substrate, the solder pad comprising a first pad and a second pad, wherein the first pad is separated from the second pad by a gap, and wherein the first pad has a smaller surface area than the second pad;
providing making at least one slot in each of the first pad and the second pad, increasing a number of edges available to align at least one part to be soldered thereto; and
defining at least one notch in each of the first pad and the second pad, such that the at least one notch is disposed on an outermost corner of a total surface area of the solder pad away that is farthest away from the gap, and an edge of the at least one notch is collinear with an edge of the at least one slot.

14. The method according to claim 13, further comprising selectively applying solder to portions of the solder pad.

15. The method according to claim 14, wherein selectively applying the solder comprises stenciling the solder to portions of the solder pad.

16. The method according to claim 14, further comprising placing a circuit element over the solder.

17. The method according to claim 16, wherein the circuit element comprises a solid state emitter or a solid state emitter package.

18. The method according to claim 16, further comprising heating and cooling the substrate to melt and harden the solder, respectively, thereby physically and electrically connecting the circuit element to the solder pad.

19. A device for a light emitter, comprising:
a substrate; and
a plurality of solder pads disposed on the substrate and configured to separately attach a plurality of different electrical components to the substrate,
wherein each of the plurality of solder pads comprises:
a first pad and a second pad,
wherein the first pad has a smaller surface area than the second solder pad, wherein the first pad and the second pad each comprise a first edge and a second edge, wherein the first edge of each of the first and second pads is an innermost edge closest to the gap, wherein the second edge of the first pad is an outermost edge of a total surface area of a respective one of the plurality of solder pads that is a farthest distance away from the gap, wherein the second edge of the second pad is an outermost edge of the total surface area of the respective one of the plurality of solder pads that is a farthest distance away from the gap, wherein each of the first edges comprises at least one slot having an outer slot edge;

wherein each of the second edges comprises at least one notch disposed on an outermost corner of the surface area;

wherein the at least one notch comprises a first notch edge and a second notch edge, wherein the first notch edge is collinear with the outer slot edge, and wherein an edge of the at least one slot is coplanar with the first edge in which the edge is formed, such that the edge is surrounded on both sides by the first edge.

20. The device according to claim 19, wherein the second notch edge is orthogonal to the outer slot edge and has a width less than 25% of an overall width of the solder pad.

21. The device according to claim 19, wherein each first pad has a same first shape and each second pad has a same second shape, the first shape being different than the second shape.

22. The device according to claim 21, wherein the plurality of solder pads are configured to separately attach a plurality of different electrical components to the pads, wherein the plurality of different electrical components are light emitting diode (LED) components.

23. The device according to claim 19, further comprising solder, wherein the solder is only disposed under portions of the plurality of different electrical components and not over areas of the pads that are not covered by the plurality of different electrical components.

24. The device according to claim 19, wherein the plurality of different electrical components are one or more of a surface-mount ceramic component, a submount-free component, a leadframe component and/or a chip on board component.

25. A solder pad for attaching a plurality of different parts to a substrate, the solder pad comprising:

a first pad;

a second pad electrically isolated from the first pad; and a gap disposed between the first pad and the second pad;

wherein the first pad and the second pad each comprise a first edge and a second edge, wherein the first edge of each of the first and second pads is an innermost edge closest to the gap, wherein the second edge of the first pad is an outermost edge of a total surface area of the solder pad that is a farthest distance away from the gap, wherein the second edge of the second pad is an outermost edge of the total surface area of the solder pad that is a farthest distance away from the gap, wherein the first edge of the first pad and the first edge of the second pad each have a plurality of slots formed therein, wherein the second edge of the first pad and the second edge of the second pad each have a plurality of notches formed in an outermost corner thereof for aligning at least one part to be soldered thereto, wherein the plurality of slots have slot edges, wherein the plurality of notches have first notch edges and second notch edges, wherein the first notch edges are collinear with at least one slot edge formed in each first edge, wherein the second notch edges are orthogonal to the at least one slot edge and have a width less than an overall width of the solder pad, and wherein each of the plurality of slots comprise a second slot edge, which is coplanar with the first edge in which the second slot edge is formed, such that the second slot edge is surrounded on both sides by the first edge.

26. The solder pad according to claim 25, wherein the first pad and the second pad are shaped differently from each other, and wherein the width of the second notch edges are less than 25% of the overall width of the solder pad.

* * * * *